United States Patent
Wang et al.

(10) Patent No.: US 6,338,998 B1
(45) Date of Patent: Jan. 15, 2002

(54) EMBEDDED DRAM FABRICATION METHOD PROVIDING ENHANCED EMBEDDED DRAM PERFORMANCE

(75) Inventors: Chen-Jong Wang; Chen-Yong Lin; Kevin Chiang, all of Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/713,652

(22) Filed: Nov. 15, 2000

(51) Int. Cl.[7] .......................................... H01L 21/8242
(52) U.S. Cl. ....................................... 438/253; 438/303
(58) Field of Search ................................ 438/238–240, 438/250–256, 381, 393–399, 303

(56) References Cited

U.S. PATENT DOCUMENTS

| | | | |
|---|---|---|---|
| 5,296,399 A | * | 3/1994 | Park |
| 5,494,841 A | * | 2/1996 | Dennison et al. |
| 5,550,078 A | * | 8/1996 | Sung |
| 5,716,862 A | * | 2/1998 | Ahmad et al. |
| 5,843,817 A | * | 12/1998 | Lee et al. ................... 438/239 |
| 5,858,831 A | | 1/1999 | Sung |
| 5,998,251 A | | 12/1999 | Wu et al. |
| 6,069,037 A | | 5/2000 | Liao |

* cited by examiner

Primary Examiner—Jey Tsai
(74) Attorney, Agent, or Firm—Tung & Associates

(57) ABSTRACT

Within a method for fabricating an embedded dynamic random access memory (DRAM) semiconductor integrated circuit microelectronic fabrication there is formed contacting a second source/drain region within a field effect transistor (FET) memory semiconductor integrated circuit microelectronic fabrication device a storage capacitor prior to forming within a field effect transistor (FET) logic semiconductor integrated circuit microelectronic fabrication device a pair of first source/drain regions. By employing such a process ordering, the field effect transistor (FET) logic semiconductor integrated circuit microelectronic device, and the embedded dynamic random access memory (DRAM) semiconductor integrated circuit microelectronic fabrication, are fabricated with enhanced performance.

11 Claims, 2 Drawing Sheets

EMBEDDED DRAM FABRICATION METHOD PROVIDING ENHANCED EMBEDDED DRAM PERFORMANCE

BACKGROUND OF THE INVENTION

1. Field of the Invention

The present invention relates generally to methods for fabricating embedded dynamic random access memory (DRAM) semiconductor integrated circuit microelectronic fabrications. More particularly, the present invention related to methods for fabricating, with enhanced performance, embedded dynamic random access memory (DRAM) semiconductor integrated circuit microelectronic fabrications.

2. Description of the Related Art

Common in the art of semiconductor integrated circuit microelectronic fabrication is the use of embedded dynamic random access memory (DRAM) semiconductor integrated circuit microelectronic fabrications that simultaneously incorporate logic semiconductor integrated circuit microelectronic fabrication devices (typically including, but not limited to, field effect transistor (FET) logic semiconductor integrated circuit microelectronic fabrication devices) and dynamic random access memory (DRAM) semiconductor integrated circuit microelectronic fabrication devices (typically including, but not limited to, field effect transistor (FET) memory semiconductor integrated circuit microelectronic fabrication devices in conjunction with storage capacitor memory semiconductor integrated circuit microelectronic fabrication devices).

Embedded dynamic random access memory (DRAM) semiconductor integrated circuit microelectronic fabrications are particularly useful within semiconductor integrated circuit microelectronic fabrication applications that require both the storage and the timely manipulation of comparatively large quantities of digital data. Such applications often include, but not limited to, digital computer graphics applications.

While embedded dynamic random access memory (DRAM) semiconductor integrated circuit microelectronic fabrications are thus desirable in the art of semiconductor integrated circuit microelectronic fabrication and often essential in the art of semiconductor integrated circuit microelectronic fabrication, embedded dynamic random access memory (DRAM) semiconductor integrated circuit microelectronic fabrications are nonetheless not entirely without problems in the art of semiconductor integrated circuit microelectronic fabrication.

In that regard, it is known in the art of semiconductor integrated circuit microelectronic fabrication that embedded dynamic random access memory (DRAM) semiconductor integrated circuit microelectronic fabrications are often difficult to efficiently fabricate with enhanced performance, insofar as the performance characteristics of logic semiconductor integrated circuit microelectronic fabrication devices within embedded dynamic random access memory (DRAM) semiconductor integrated circuit microelectronic fabrications are affected by different semiconductor integrated circuit microelectronic fabrication processing considerations in comparison with the performance characteristics of memory semiconductor integrated circuit microelectronic fabrication devices within embedded dynamic random access memory (DRAM) semiconductor integrated circuit microelectronic fabrications.

It is thus desirable in the art of embedded dynamic random access memory (DRAM) semiconductor integrated circuit microelectronic fabrication to provide methods and materials that in turn provide embedded dynamic random access memory (DRAM) semiconductor integrated circuit microelectronic fabrications with enhanced performance.

It is towards the foregoing object that the present invention is directed.

Various embedded dynamic random access memory (DRAM) semiconductor integrated circuit microelectronic fabrications having desirable properties, and methods for fabrication thereof, have been disclosed within the art of semiconductor integrated circuit microelectronic fabrication.

For example, Sung, in U.S. Pat. No. 5,858,831, discloses a method for forming, with both enhanced performance and enhanced manufacturing economy, an embedded dynamic random access memory (DRAM) semiconductor integrated circuit microelectronic fabrication. To realize the foregoing object, the method employs only a single additional photolithographic masking step for forming, in part, within the embedded dynamic random access memory (DRAM) semiconductor integrated circuit microelectronic fabrication a field effect transistor (FET) logic semiconductor integrated circuit microelectronic fabrication device having formed therein a comparatively thinner gate dielectric layer in comparison with a gate dielectric layer formed within a field effect transistor (FET) memory semiconductor integrated circuit microelectronic fabrication device within the embedded dynamic random access memory (DRAM) semiconductor integrated circuit microelectronic fabrication.

In addition, Wu et al., in U.S. Pat. No. 5,998,251, similarly also discloses a method for forming, with both enhanced performance and enhanced manufacturing economy, an embedded dynamic random access memory (DRAM) semiconductor integrated circuit microelectronic fabrication. To realize the foregoing object, the method provides for forming in part simultaneously within the embedded dynamic random access memory (DRAM) semiconductor integrated circuit microelectronic fabrication a conductor interconnect layer within a logic device region within the embedded dynamic random access memory (DRAM) semiconductor integrated circuit microelectronic fabrication and a storage capacitor within a memory device region within the embedded dynamic random access memory (DRAM) semiconductor integrated circuit microelectronic fabrication.

Finally, Liao, in U.S. Pat. No. 6,069,037, similarly yet also discloses a method for forming, with both enhanced performance and with enhanced manufacturing economy, an embedded dynamic random access memory (DRAM) semiconductor integrated circuit microelectronic fabrication. To realize the foregoing object, the method comprises a self-aligned method which employs a pair of photoresist masking steps, only one of which requires a critical dimensional tolerance, to form within the embedded dynamic random access memory (DRAM) semiconductor integrated circuit microelectronic fabrication a field effect transistor (FET) logic semiconductor integrated circuit microelectronic fabrication device having formed therein a comparatively thinner gate electrode in comparison with a gate electrode employed within a field effect transistor (FET) memory semiconductor integrated circuit microelectronic fabrication device within the embedded dynamic access memory (DRAM) semiconductor integrated circuit microelectronic fabrication.

Desirable in the art of semiconductor integrated circuit microelectronic fabrication are additional methods and materials that may be employed for fabricating, with enhanced performance, embedded dynamic random access memory (DRAM) semiconductor integrated circuit microelectronic fabrications.

It is towards the foregoing object that the present invention is directed.

SUMMARY OF THE INVENTION

A first object of the present invention is to provide a method for fabricating an embedded dynamic random access memory (DRAM) semiconductor integrated circuit microelectronic fabrication.

A second object of the present invention is to provide a method in accord with the first object of the present invention, wherein the embedded dynamic random access memory (DRAM) semiconductor integrated circuit microelectronic fabrication is fabricated with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating an embedded dynamic random access memory (DRAM) semiconductor integrated circuit microelectronic fabrication. To practice the method of the present invention, there is provided a semiconductor substrate. There is then formed upon a first portion of the semiconductor substrate a first gate dielectric layer in turn having formed thereupon a first gate electrode, where the first portion of the semiconductor substrate is separated from a second portion of the semiconductor substrate having formed thereupon a second gate dielectric layer in turn having formed thereupon upon a second gate electrode. There is also formed within the first portion of the semiconductor substrate and separated by the first gate electrode a pair of first source/drain regions. Similarly, there is also formed within the second portion of the semiconductor substrate and separated by the second gate electrode a pair of second source/drain regions. Finally, there is also formed contacting one of the pair of second source/drain regions a storage capacitor, wherein the pair of first source/drain regions is formed after forming contacting the one of the pair of second source/drain regions the storage capacitor.

Within the present invention: (1) the first portion of the semiconductor substrate comprises a logic device region of the semiconductor substrate having formed thereupon a field effect transistor (FET) logic semiconductor integrated circuit microelectronic fabrication device; and (2) the second portion of the semiconductor substrate comprises a memory device region of the semiconductor substrate having formed thereupon a field effect transistor (FET) memory semiconductor integrated microelectronic fabrication device in conjunction with the storage capacitor.

There is provided by the present invention a method for fabricating an embedded dynamic random access memory (DRAM) semiconductor integrated circuit microelectronic fabrication, wherein the embedded dynamic random access memory (DRAM) semiconductor integrated circuit microelectronic fabrication is fabricated with enhanced performance. The present invention realizes the foregoing object by forming, when fabricating an embedded dynamic random access memory (DRAM) semiconductor integrated circuit microelectronic fabrication, a storage capacitor contacting one of a pair of second source/drain regions which is separated by a second gate electrode, prior to forming a pair of first source/drain regions separated by a first gate electrode, further wherein the pair of first source/drain regions is employed within a field effect transistor (FET) logic semiconductor integrated circuit microelectronic device within a logic device region of a semiconductor substrate from which is fabricated the embedded dynamic random access memory (DRAM) semiconductor integrated circuit microelectronic fabrication and the pair of second source/drain regions is employed within a field effect transistor (FET) memory semiconductor integrated circuit microelectronic fabrication device within a memory device region within the semiconductor substrate from which is fabricated the embedded dynamic random access memory (DRAM) semiconductor integrated circuit microelectronic fabrication. By employing within the context of the present invention the foregoing order of fabrication, performance of the field effect transistor (FET) logic semiconductor integrated circuit microelectronic fabrication device within the embedded dynamic random access memory (DRAM) semiconductor integrated circuit microelectronic fabrication is enhanced insofar as a pair of first source/drain regions from which is comprised the field effect transistor (FET) logic semiconductor integrated circuit microelectronic fabrication device is not exposed to temperature excursions and additional processing incident to forming the storage capacitor contacting the one of the pair of second source/drain regions from which is comprised the field effect transistor (FET) memory semiconductor integrated circuit microelectronic fabrication device within the embedded dynamic random access memory (DRAM) semiconductor integrated circuit microelectronic fabrication.

The method of the present invention is readily commercially implemented. The present invention employs methods and materials as are otherwise generally known in the art of semiconductor integrated circuit microelectronic fabrication, but employed within the context of a specific ordering to provide the present invention. Since it is thus a specific ordering of methods and materials that provides at least in part the present invention, rather than the existence of specific methods and materials that provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating an embedded dynamic random access memory (DRAM) semiconductor integrated circuit microelectronic fabrication, wherein the embedded dynamic random access memory (DRAM) semiconductor integrated circuit microelectronic fabrication is fabricated with enhanced performance. The present invention realizes the foregoing object by forming, when fabricating an embedded dynamic random access memory (DRAM) semiconductor integrated circuit microelectronic fabrication, a storage capacitor contacting one of a pair of second source/drain regions which is separated by a second gate electrode, prior to forming a pair of first source/drain regions separated by a first gate electrode, further wherein the pair of first source/drain regions is employed within a field effect transistor (FET) logic semiconductor integrated circuit microelectronic device within a logic device region of a semiconductor substrate from which is fabricated the embedded dynamic random access memory (DRAM) semiconductor integrated circuit microelectronic fabrication and the pair of second source/drain regions is employed within a field effect transistor (FET) memory semiconductor integrated circuit microelectronic fabrication device within a memory device region within the semiconductor substrate from which is fabricated the embedded dynamic random access memory (DRAM) semiconductor integrated circuit microelectronic fabrication. By employing within the context of the present invention the foregoing order of fabrication, performance of the field effect transistor (FET) logic semiconductor integrated circuit microelectronic fabrication device within the embedded dynamic random access memory (DRAM) semiconductor integrated circuit microelectronic fabrication is enhanced insofar as a pair of first source/drain regions from which is comprised the field effect transistor (FET) logic semiconductor integrated circuit microelectronic fabrication device is not exposed to temperature excursions and additional processing incident to forming the storage capacitor contacting the one of the pair of second source/drain regions from which is comprised the field effect transistor (FET) memory semiconductor integrated circuit microelectronic fabrication device within the embedded dynamic random access memory (DRAM) semiconductor integrated circuit microelectronic fabrication.

Referring now to FIG. 1 to FIG. 5, there is shown a series of schematic cross-sectional diagrams illustrating the results of progressive stages of fabrication, in accord with a preferred embodiment of the present invention, of an embedded dynamic random access memory (DRAM) semiconductor integrated circuit microelectronic fabrication.

Figure 1:
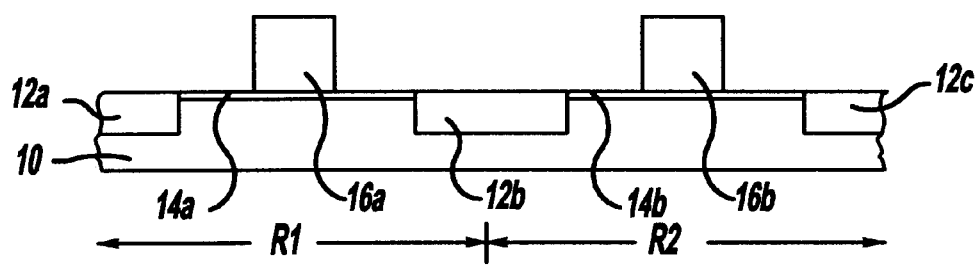
FIG. 1, FIG. 2, FIG. 3, FIG. 4 and FIG. 5 show a series of schematic cross-sectional diagrams illustrating the results of progressive stages in fabricating, in accord with a preferred embodiment of the present invention, an embedded dynamic random access memory (DRAM) semiconductor integrated circuit microelectronic fabrication.

Shown in FIG. 1 is a schematic cross-sectional diagram of the embedded dynamic random access memory (DRAM) semiconductor integrated circuit microelectronic fabrication at an early stage in its fabrication in accord with the preferred embodiment of the present invention.

Shown in FIG. 1, in a first instance, is a semiconductor substrate 10, having formed therein a series of shallow trench isolation regions 12a, 12b and 12c which define a pair of active regions of the semiconductor substrate 10. As is further illustrated within the schematic cross-sectional diagram of FIG. 1, a first of the active regions of the semiconductor substrate 10 is formed in a first region R1 of the semiconductor substrate 10. Similarly, the first region R1 of the semiconductor substrate 10 is a logic device region of the semiconductor substrate 10 upon which is formed a field effect transistor (FET) logic semiconductor integrated circuit microelectronic fabrication device. In addition, and as is also further illustrated within the schematic cross-sectional diagram of FIG. 1, a second of the active regions of the semiconductor substrate 10 is formed in a second region R2 of the semiconductor substrate 10. Similarly, the second region R2 of the semiconductor substrate 10 is a memory device region of the semiconductor substrate 10 upon which is formed a field effect transistor (FET) memory semiconductor integrated circuit microelectronic fabrication device.

Within the preferred embodiment of the present invention with respect to the semiconductor substrate 10, and although it is known in the art of semiconductor integrated circuit microelectronic fabrication, including but not limited to embedded dynamic random access memory (DRAM) semiconductor integrated circuit microelectronic fabrication, that semiconductor substrates are available with either dopant polarity, several dopant concentrations and various crystallographic orientations, for the preferred embodiment of the present invention, the semiconductor substrate 10 typically and preferably comprises a (100) silicon semiconductor substrate, base portions of which are formed with comparatively low dopant concentration levels, while upper lying portions of which are formed with comparatively higher, and nominally intermediate, dopant concentration levels.

Similarly, within the preferred embodiment of the present invention with respect to the series of shallow trench isolation regions 12a, 12b and 12c, and although it is also known in the art of semiconductor integrated circuit microelectronic fabrication that isolation regions may in general be formed within semiconductor substrates while employing isolation region thermal growth methods and isolation region deposition/patterning methods, for the preferred embodiment of the present invention, the series of shallow trench isolation regions 12a, 12b and 12c is typically and preferably formed at least in part of an isolation region deposition/patterning method to form the series of shallow trench isolation regions 12a, 12b and 12c at least in part of a silicon oxide shallow trench isolation dielectric material.

There is also shown within the schematic cross-sectional diagram of FIG. 1: (1) formed upon the first active region of the semiconductor substrate 10 a first gate dielectric layer 14a in turn having formed thereupon a first gate electrode 16a; and (2) formed upon the second active region of the semiconductor substrate 10 a second gate dielectric layer 14b in turn having formed thereupon a second gate electrode 16b.

Within the preferred embodiment of the present invention with respect to the first gate dielectric layer 14a and the second gate dielectric layer 14b, and although it is known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention the first gate dielectric layer 14a and the second gate dielectric layer 14b are both typically and preferably formed employing a gate dielectric layer thermal growth method to form the first gate dielectric layer 14a of thickness from about 15 to about 30 angstroms and the second gate dielectric layer 14b of thickness from about 50 to about 80 angstroms. Similarly, although within the preferred embodiment of the present invention the first gate dielectric layer 14a and the second gate dielectric layer 14b are typically and preferably formed simultaneously upon the semiconductor substrate 10 while employing a thermal oxidation method which provides each of the first gate dielectric layer 14a and the second gate dielectric layer 14b of an equivalent thickness from about 50 to about 80 angstroms, each of the first gate dielectric layer 14a and the second gate dielectric layer 14b may be formed employing separate methods which provide the first gate dielectric layer 14a and the second gate dielectric layer 14b of different thicknesses.

Finally, within the preferred embodiment of the present invention with respect to the first gate electrode 16a and the second gate electrode 16b, although the first gate electrode 16a and the second gate electrode 16b may be formed from any of several gate electrode materials as are conventional in the art of semiconductor integrated circuit microelectronic fabrication, including but not limited to metals, metal alloys, doped polysilicon (having a dopant concentration of greater than about 1E20 dopant atoms per cubic centimeter) and polycide (doped polysilicon/metal silicide) gate electrode materials, for the preferred embodiment of the present invention each of the first gate electrode 16a and the second gate electrode 16b is typically and preferably formed at least in part of a patterned doped polysilicon layer formed to a thickness of from about 1000 to about 3000 angstroms. Similarly, and analogously with the first gate dielectric layer 14a and the second gate dielectric layer 14b, and given appropriate intervening fabrication steps, the first gate electrode 16a and the second gate electrode 16b need not necessarily be formed of equivalent thicknesses, compositions or dopant polarities, although they may be. In addition, within the preferred embodiment of the present invention, the second gate electrode 16b will incident to certain processing schemes which facilitate subsequent self aligned contact formation employ formed thereupon a patterned hard mask layer formed of a hard mask material selected from the group including but not limited to silicon oxide hard mask materials, silicon nitride hard mask materials and silicon oxynitride hard mask materials, while the first gate electrode 16a will not necessarily have formed thereupon a patterned hard mask layer.

Figure 2:
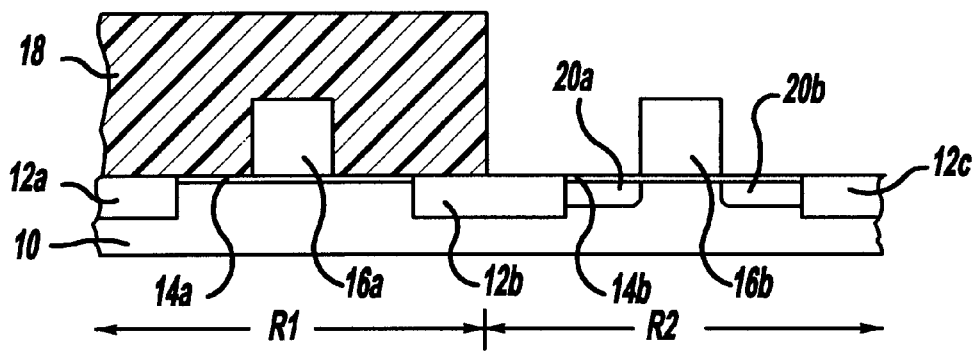

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there has been formed upon the logic device region of the semiconductor substrate 10, and covering the first gate dielectric layer 14a and the first gate electrode 16a, a patterned photoresist layer 18.

Within the preferred embodiment of the present invention with respect to the patterned photoresist layer 18, the patterned photoresist layer 18 may be formed of photoresist materials as are conventional in the art of semiconductor integrated circuit microelectronic fabrication, where such photoresist materials may include, but are not limited to, positive photoresist materials and negative photoresist materials. Typically and preferably, the patterned photoresist layer 18 is formed to a thickness of from about 3000 to about 10000 angstroms.

Shown also within the schematic cross-sectional diagram of FIG. 2, formed into the memory device region of the semiconductor substrate 10 and separated by the second gate electrode 16b is a pair of second source/drain regions 20a and 20b.

Within the preferred embodiment of the present invention with respect to the pair of second source/drain regions 20a and 20b, the pair of second source/drain regions 20a and 20b is typically and preferably formed employing an ion implantation method as is otherwise conventional in the art of semiconductor integrated circuit microelectronic fabrication, further wherein the ion implantation method typically and preferably employs an ion implantation dose of from about $10^{13}$ to about $10^{15}$ dopant ions per square centimeter and an ion implantation dose of from about 20 to about 90 kev, while employing a dopant ion of appropriate polarity.

Figure 3:
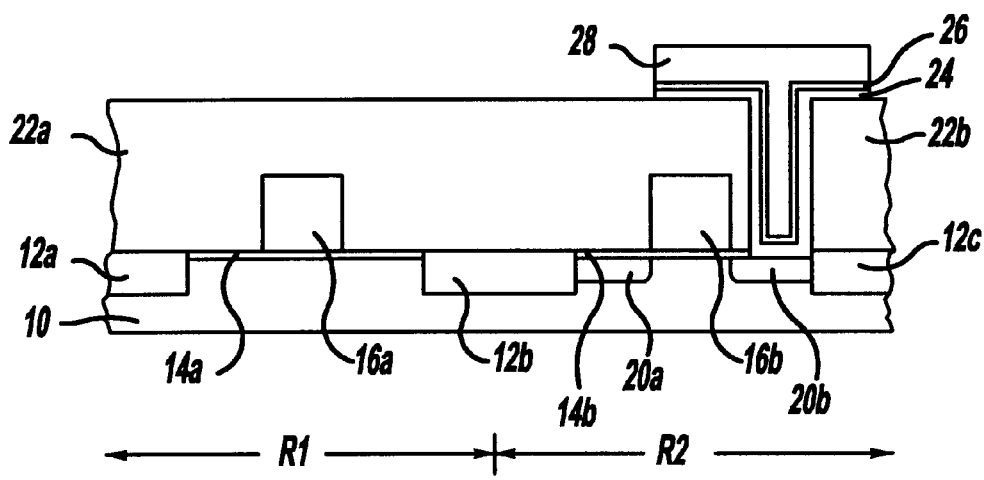

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the patterned photoresist layer 18 has been stripped from the semiconductor integrated circuit microelectronic fabrication.

Within the preferred embodiment of the present invention, the patterned photoresist layer 18 may be stripped from the semiconductor integrated circuit microelectronic fabrication whose schematic cross-sectional diagram is illustrated in FIG. 2 to provide in part the semiconductor integrated circuit microelectronic fabrication whose schematic cross-sectional diagram is illustrated in FIG. 3 while employing photoresist stripping methods and materials as are otherwise generally known in the art of semiconductor integrated circuit microelectronic fabrication. Such photoresist stripping methods and materials may include, but not limited to, wet chemical photoresist stripping methods and materials and dry plasma photoresist stripping methods and materials.

Shown also within the schematic cross-sectional diagram of FIG. 3, and covering both the logic device region and the memory device region of the semiconductor substrate 10, is a pair of patterned inter-polysilicon dielectric (IPD) layers 22a and 22b, which in conjunction with: (1) a patterned second gate dielectric layer 14b' which is formed from the second gate dielectric layer 14b; and (2) the shallow trench isolation region 12c, define a first aperture which accesses a portion of the second source/drain region 20b.

Within the preferred embodiment of the present invention with respect to the pair of patterned inter-polysilicon dielectric (IPD) layers 22a and 22b, the pair of patterned inter polysilicon dielectric (IPD) layers 22a and 22b may be formed employing methods and materials as are otherwise generally conventional in the art of semiconductor integrated circuit microelectronic fabrication, wherein such methods will typically and preferably include but are not limited to deposition methods, planarization methods and patterning methods (the last of which are also employed for forming from the second gate dielectric layer 14b the patterned second gate dielectric layer 14b') as are generally conventional in the art of semiconductor integrated circuit microelectronic fabrication, to form the pair of patterned inter-polysilicon dielectric (IPD) layers 22a and 22b of dielectric materials such as but not limited to silicon oxide dielectric materials, silicon nitride dielectric materials and silicon oxynitride dielectric materials. Typically and preferably, the pair of patterned inter-polysilicon dielectric (IPD) layers 22a and 22b is formed of a silicon oxide dielectric material formed to a planarized thickness of from about 4000 to about 6000 angstroms, while covering in particular the second gate electrode 16b, and while forming in conjunction with the patterned second gate dielectric layer 14b' and the shallow trench isolation region 12c the first aperture which accesses the portion of the second source/drain region 20b.

Finally, there is also shown within the schematic cross-sectional diagram of FIG. 3 formed into the first aperture defined by the pair of patterned inter-polysilicon dielectric layers 22a and 22b, the patterned second gate dielectric layer 14b' and the shallow trench isolation region 12c: (1) a capacitor node layer 24, having formed thereupon; (2) a capacitor dielectric layer 26, in turn having formed thereupon; (3) a capacitor plate layer 28, which in an aggregate form a storage capacitor contacting the second source/drain region 20b.

Within the preferred embodiment of the present invention with respect to each of the capacitor node layer 24, the capacitor dielectric layer 26 and the capacitor plate layer 28, each of the capacitor node layer 24, the capacitor dielectric layer 26 and the capacitor plate layer 28 may be formed employing methods and materials as are otherwise generally conventional in the art of semiconductor integrated circuit microelectronic fabrication. Typically and preferably: (1) the capacitor node layer 24 is formed to a thickness of from about 500 to about 1000 angstroms from a doped polysilicon capacitor node material; (2) the capacitor dielectric layer 26 is formed to a thickness of from about 30 to about 80 angstroms from a silicon containing capacitive dielectric material, such as but not limited to a silicon oxide capacitive dielectric material, a silicon nitride capacitive dielectric material and/or a silicon oxynitride capacitive dielectric material; and (3) the capacitor plate layer 28 is typically and preferably formed to a thickness of from about 1000 to about 2000 angstroms from a doped polysilicon capacitor plate material.

As is understood by a person skilled in the art, and in accord with portions of the above disclosure, and further in particular under circumstances where the second gate electrode 16b has formed thereupon a hard mask layer, it is feasible to form within the present invention the first aperture into which is formed the storage capacitor contacting the second source/drain region 20b in a self aligned fashion, such as to maximize density within an embedded dynamic random access memory (DRAM) semiconductor integrated circuit microelectronic fabrication derived from further fabrication of the semiconductor integrated circuit microelectronic fabrication whose schematic cross-sectional diagram is illustrated in FIG. 3.

Figure 4:
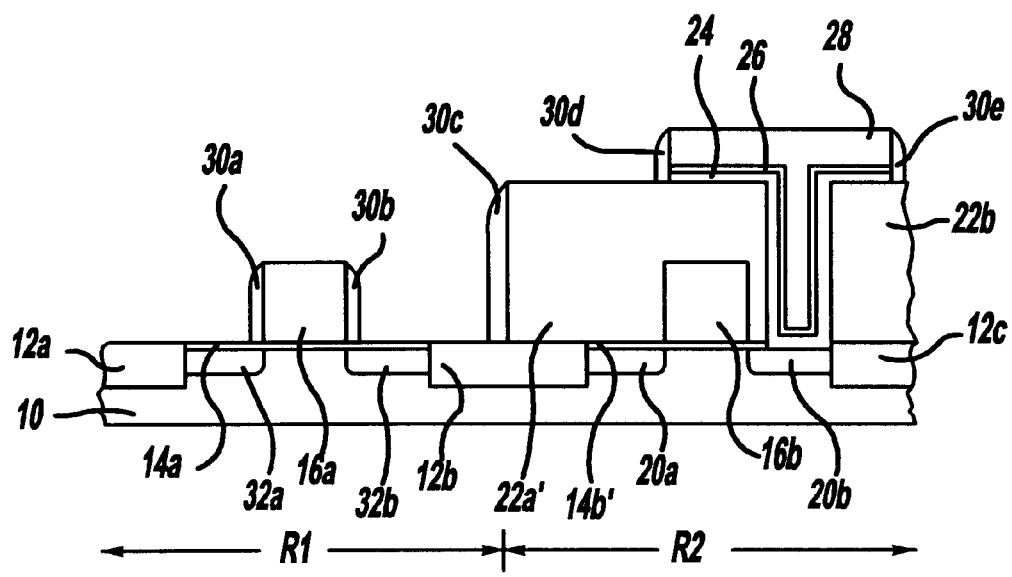

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the patterned inter-polysilicon dielectric (IPD) layer 22a has been further patterned to form a twice patterned inter-polysilicon dielectric (IPD) layer 22a'.

Within the preferred embodiment of the present invention, the patterned inter-polysilicon dielectric (IPD) layer 22a may be further patterned to form the twice patterned inter-polysilicon dielectric (IPD) layer 22a' while employing methods as are generally conventional in the art of semiconductor integrated circuit microelectronic fabrication, such methods including but not limited to wet chemical etch methods and dry plasma etch methods.

There is also shown within the schematic cross-sectional diagram of FIG. 4 formed adjoining a series of edges of the first gate electrode 16a, the twice patterned inter-polysilicon dielectric (IPD) layer 22a' and a stack of layers comprising the capacitor node layer 24, the capacitor dielectric layer 26 and the capacitor plate layer 28 a series of dielectric spacer layers 30a, 30b, 30c, 30d and 30e.

Within the preferred embodiment of the present invention with respect to the series of dielectric spacer layers 30a, 30b, 30c, 30d and 30e, the series of dielectric spacer layers 30a, 30b, 30c, 30d and 30e may be formed employing blanket dielectric layer deposition methods and anisotropic etch back methods as are conventional in the art of semiconductor integrated circuit microelectronic fabrication. Typically and preferably the series of dielectric spacer layers 30a, 30b, 30c, 30d and 30e is formed of a silicon nitride dielectric material.

Finally, there is also shown within the schematic cross-sectional diagram of FIG. 4 formed within the first active region of the semiconductor substrate within the logic device region of the semiconductor substrate 10 a pair of first source/drain regions 32a and 32b separated by the first gate electrode 16a.

Within the preferred embodiment of the present invention with respect to the pair of first source/drain regions 32a and 32b, and analogously with the pair of second source/drain regions 20a and 20b, the pair of first source/drain regions 32a and 32b may be formed employing ion implantation methods as are similarly also conventional in the art of semiconductor integrated circuit microelectronic fabrication. As is understood by a person skilled in the art, such ion implantation methods typically and preferably employ: (1) a comparatively low dose ion implant method employing an ion implantation dose of from about $10^{13}$ to about $10^{14}$ ions per square centimeter and an ion implantation energy of from about 20 to about 50 kev prior to forming the series of dielectric spacer layers 30a, 30b, 30c, 30d and 30e; followed by (2) a comparatively high dose ion implant method employing an ion implantation dose of from about $10^{14}$ to about $10^{15}$ ions per square centimeter and an ion implant energy of from about 40 to about 100 kev after forming the series of dielectric spacer layers 30a, 30b, 30c, 30d and 30e.

As is further understood by a person skilled in the art, the foregoing two-step ion implant method inherently provides within the pair of first source/drain regions 32a and 32b a pair of comparatively lightly doped regions formed closer to the first gate electrode 16a, where the pair of comparatively lightly doped regions is overlapped by a pair of comparatively heavily doped regions formed further spaced from the first gate electrode 16a.

Thus, and in accord in general with the foregoing description: (1) the first gate electrode 16a is completely formed prior to forming the storage capacitor contacting the second source/drain region 20b, as illustrated within the schematic cross-sectional diagrams of FIG. 2 and FIG. 3; and (2) both the pair of comparatively lightly doped regions and the pair of comparatively heavily doped regions with the pair of first source/drain regions 32a and 32b are formed after forming the storage capacitor contacting the second source/drain region 20b, as illustrated within the schematic cross-sectional diagrams of FIG. 3 and FIG. 4.

Figure 5:
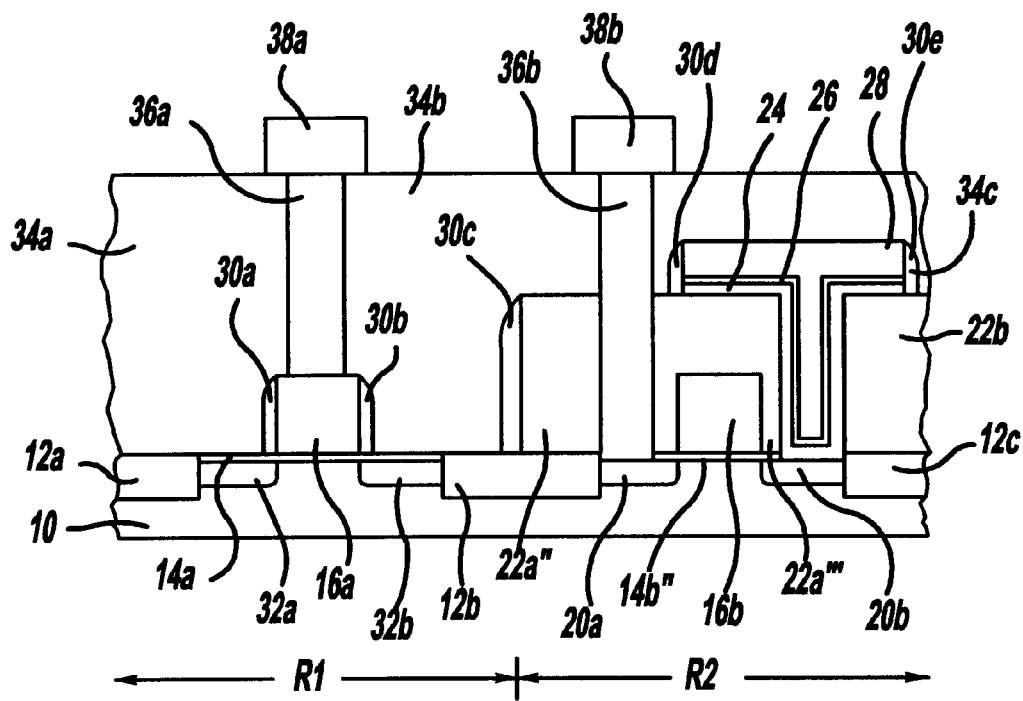

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is formed over the semiconductor integrated circuit microelectronic fabrication a series of patterned pre-metal dielectric (PMD) layers 34a, 34b and 34c, which in conjunction with: (1) further patterning of the twice patterned inter-polysilicon dielectric (IPD) layer 24a' to form a pair of three times patterned inter-polysilicon dielectric (IPD) layers 24a" and 24a'", as well as; (2) further patterning of the patterned second gate dielectric layer 14b' to form a twice patterned second gate dielectric layer 14b", provides a pair of second apertures, one reaching the surface of the first gate electrode 16a and the other reaching the surface of the second source/drain region 20a.

Within the preferred embodiment of the present invention, the series of patterned pre-metal dielectric layers 34a, 34b and 34c may be formed and patterned (and sequentially therewith the twice patterned inter-polysilicon dielectric (IPD) layer 24a' may be further patterned to form the pair of three times patterned inter-polysilicon dielectric (IPD) layer 24a" and 24a'" and the patterned second gate dielectric layer 14b' may be further patterned to form the twice patterned second gate dielectric layer 14b"), while employing methods and materials as are conventional in the art of semiconductor integrated circuit microelectronic fabrication, such methods and materials including but not limited to wet chemical etching methods and materials, as well as dry plasma etching methods and materials.

Finally, there is also shown within the schematic cross-sectional diagram of FIG. 5 formed into the pair of second apertures a pair of conductor contact studs 36a and 36b in turn having formed thereupon a pair of patterned first conductor layers 38a and 38b.

Within the preferred embodiment of the present invention, each of the pair of conductor contact studs 36a and 36b and each of the pair of patterned first conductor layers 38a and 38b may be formed employing methods and materials as are conventional in the art of semiconductor integrated circuit microelectronic fabrication. Typically and preferably, although not exclusively, each of the pair of conductor contact studs 36a and 36b is formed of a tungsten, tungsten alloy, doped polysilicon or polycide conductor material, while each of the pair of patterned first conductor layers 38a and 38b is formed of an aluminum, aluminum alloy, copper or copper alloy conductor material.

Upon fabricating the semiconductor integrated circuit microelectronic fabrication whose schematic cross-sectional diagram is illustrated in FIG. 5, there is fabricated an embedded dynamic random access memory (DRAM) semiconductor integrated circuit microelectronic fabrication with enhanced performance. The embedded dynamic random access memory (DRAM) semiconductor integrated circuit microelectronic fabrication realizes the foregoing object by forming when fabricating the embedded dynamic random access memory (DRAM) semiconductor integrated circuit microelectronic fabrication a pair of source/drain regions within a field effect transistor (FET) logic semiconductor integrated circuit microelectronic fabrication device within a logic device region of a semiconductor substrate from which is fabricated the embedded dynamic random access memory (DRAM) semiconductor integrated circuit microelectronic fabrication after having formed a storage capacitor contacting a source/drain region within a field effect transistor (FET) memory semiconductor integrated circuit microelectronic fabrication device within a memory device region of the semiconductor substrate from which is fabricated the embedded dynamic random access memory (DRAM) semiconductor integrated circuit microelectronic fabrication.

As is understood by a person skilled in the art, the preferred embodiment of the present invention is illustrative of the present invention rather than limiting of the present invention. Revisions and modifications may be made to methods, materials, structures and dimensions employed for fabricating an embedded dynamic random access memory (DRAM) semiconductor integrated circuit microelectronic fabrication in accord with the preferred embodiment of the present invention while still providing a method for fabricating an embedded dynamic random access memory (DRAM) semiconductor integrated circuit microelectronic fabrication in accord with the present invention, further in accord with the accompanying claims.

What is claimed is:

1. A method for fabricating an embedded dynamic random access memory (DRAM) semiconductor integrated circuit microelectronic fabrication comprising:

providing a semiconductor substrate;

forming upon a first portion of the semiconductor substrate a first gate dielectric layer in turn having formed thereupon a first gate electrode, the first portion of the semiconductor substrate being separated from a second portion of the semiconductor substrate having formed thereupon a second gate dielectric layer in turn having formed thereupon upon a second gate electrode;

forming within the first portion of the semiconductor substrate, and separated by the first gate electrode, a pair of first source/drain regions, where the pair of first source/drain regions comprises
    a pair of comparatively lightly doped regions formed closer to the first gate electrode; and
    a pair of comparatively heavily doped regions formed further spaced from the first gate electrode and overlapped by the pair of comparatively lightly doped regions;

forming within the second portion of the semiconductor substrate and separated by the second gate electrode a pair of second source/drain regions; and forming contacting one of the pair of second source/drain regions a storage capacitor, wherein:
    the first gate electrode is formed prior to forming contacting the one of the second source/drain regions the storage capacitor, and
    both the pair of comparatively lightly doped regions and the pair of comparatively heavily doped regions within the pair of first source/drain regions are formed after forming contacting the one of the pair of second source/drain regions the storage capacitor.

2. The method of claim 1 wherein the first gate electrode is employed within a field effect transistor (FET) logic device within the embedded dynamic random access memory semiconductor integrated circuit microelectronic fabrication and the second gate electrode is employed within a field effect transistor (FET) memory device within the embedded dynamic random access memory (DRAM) semiconductor integrated circuit microelectronic fabrication.

3. The method of claim 2 wherein by forming the pair of first source/drain regions after forming the storage capacitor contacting the one of the pair of second source/drain regions, the field effect transistor (FET) logic device is formed with enhanced performance.

4. The method of claim 1 wherein the first gate dielectric layer is formed to a thickness of from about 15 to about 30 angstroms.

5. The method of claim 1 wherein the first gate electrode is formed to a thickness of from about 1000 to about 3000 angstroms.

6. The method of claim 1 wherein the second gate dielectric layer is formed to a thickness of from about 50 to about 80 angstroms.

7. The method of claim 1 wherein the second gate electrode is formed to a thickness of from about 1000 to about 3000 angstroms.

8. The method of claim 1 wherein the first gate dielectric layer and the second gate dielectric layer are formed of different thicknesses.

9. The method of claim 1 wherein the first gate dielectric layer and the second gate dielectric layer are formed of equivalent thicknesses.

10. The method of claim 1 wherein the first gate electrode and the second gate electrode are formed of different thicknesses.

11. The method of claim 1 wherein the first gate electrode and the second gate electrode are formed of equivalent thicknesses.

* * * * *